United States Patent
Ou Yang et al.

(10) Patent No.: US 12,408,320 B2
(45) Date of Patent: Sep. 2, 2025

(54) SEMICONDUCTOR STRUCTURE AND METHOD OF MANUFACTURING THE SAME

(71) Applicant: Winbond Electronics Corp., Taichung (TW)

(72) Inventors: Tzu-Ming Ou Yang, Taichung (TW); Chun-Chieh Wang, Taichung (TW); Shu-Ming Lee, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 382 days.

(21) Appl. No.: 17/572,898

(22) Filed: Jan. 11, 2022

(65) Prior Publication Data

US 2022/0223598 A1 Jul. 14, 2022

(30) Foreign Application Priority Data

Jan. 11, 2021 (TW) ................................ 110100933

(51) Int. Cl.
*H10B 12/00* (2023.01)
*H10D 64/01* (2025.01)

(52) U.S. Cl.
CPC ........... *H10B 12/30* (2023.02); *H10B 12/482* (2023.02); *H10D 64/021* (2025.01)

(58) Field of Classification Search
CPC ................ H10B 12/482; H10B 12/485; H10B 12/0335; H10B 12/30; H01L 29/6656; H01L 21/76897; H10D 64/021
See application file for complete search history.

(56) References Cited

U.S. PATENT DOCUMENTS

| | | | |
|---|---|---|---|
| 2005/0090055 A1* | 4/2005 | Lee | H01L 21/31138 257/E21.507 |
| 2009/0166703 A1 | 7/2009 | Lin et al. | |
| 2012/0187535 A1* | 7/2012 | Lee | H10B 12/31 257/532 |
| 2014/0227851 A1* | 8/2014 | Lee | H01L 21/76829 438/381 |
| 2015/0056801 A1* | 2/2015 | Park | H01L 21/7682 438/655 |
| 2016/0111535 A1 | 4/2016 | Lee et al. | |
| 2016/0329337 A1* | 11/2016 | Hwang | H10B 12/0335 |
| 2020/0203354 A1* | 6/2020 | Lee | H10B 12/02 |

* cited by examiner

*Primary Examiner* — Britt D Hanley
*Assistant Examiner* — Casey Paul Boatman
(74) *Attorney, Agent, or Firm* — Muncy, Geissler, Olds & Lowe, P.C.

(57) ABSTRACT

A semiconductor structure and its manufacturing method are provided. A semiconductor structure includes a substrate and several bit lines on the substrate. Each of the bit lines includes a first conductive layer on the substrate, a second conductive layer on the first conductive layer, and a hardmask layer on the second conductive layer. The semiconductor structure further includes several contacts disposed on the substrate and positioned between two adjacent bit lines, wherein the bottom surfaces of the contacts physically contact the substrate. The top surfaces of the contacts are not higher than the top surfaces of the hardmask layers. Each of the contacts includes a bottom contact part on the substrate and a top contact part on the bottom contact part, and a width of a top surface of the top contact part is greater than a width of a top surface of the bottom contact part.

20 Claims, 10 Drawing Sheets

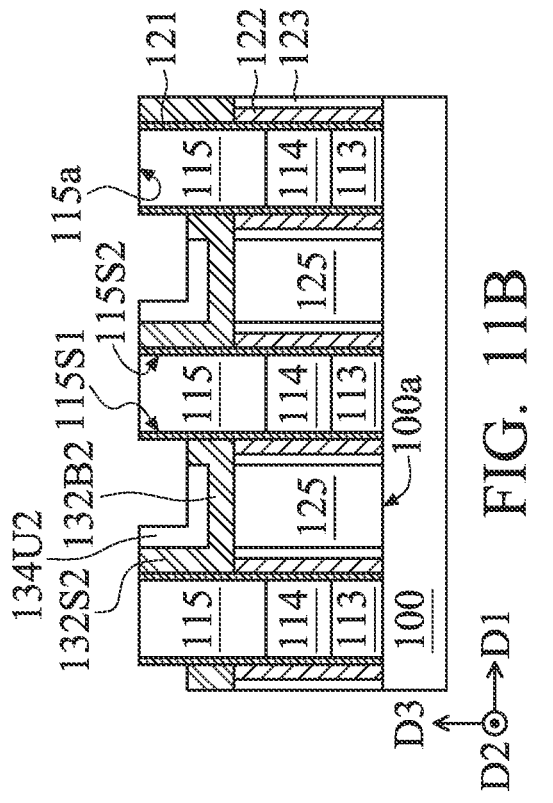
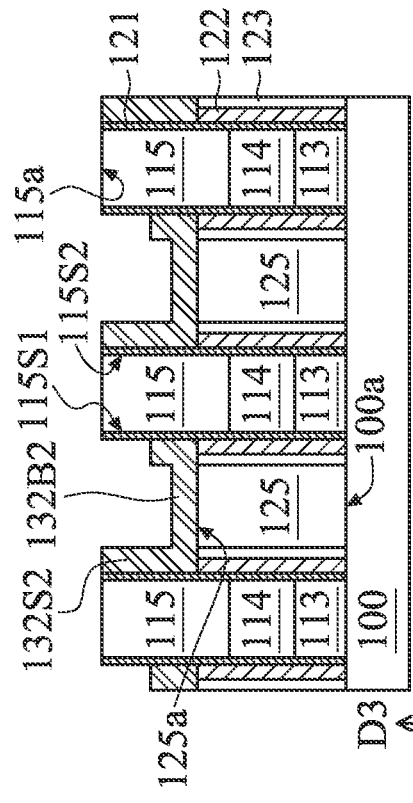
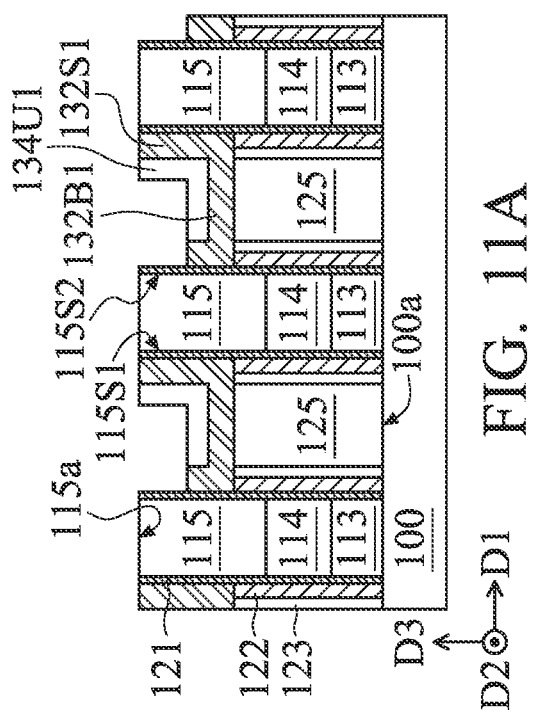
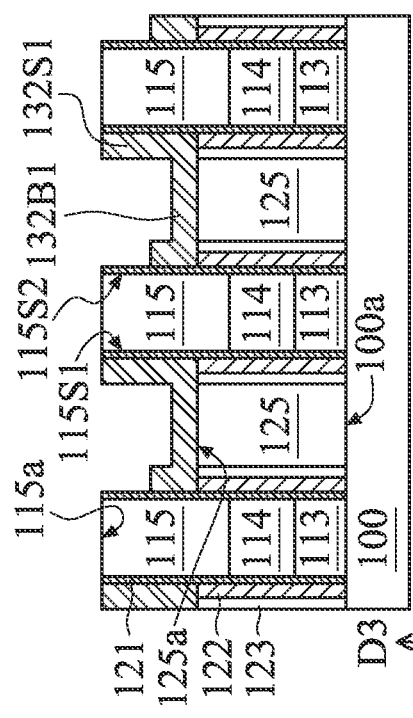

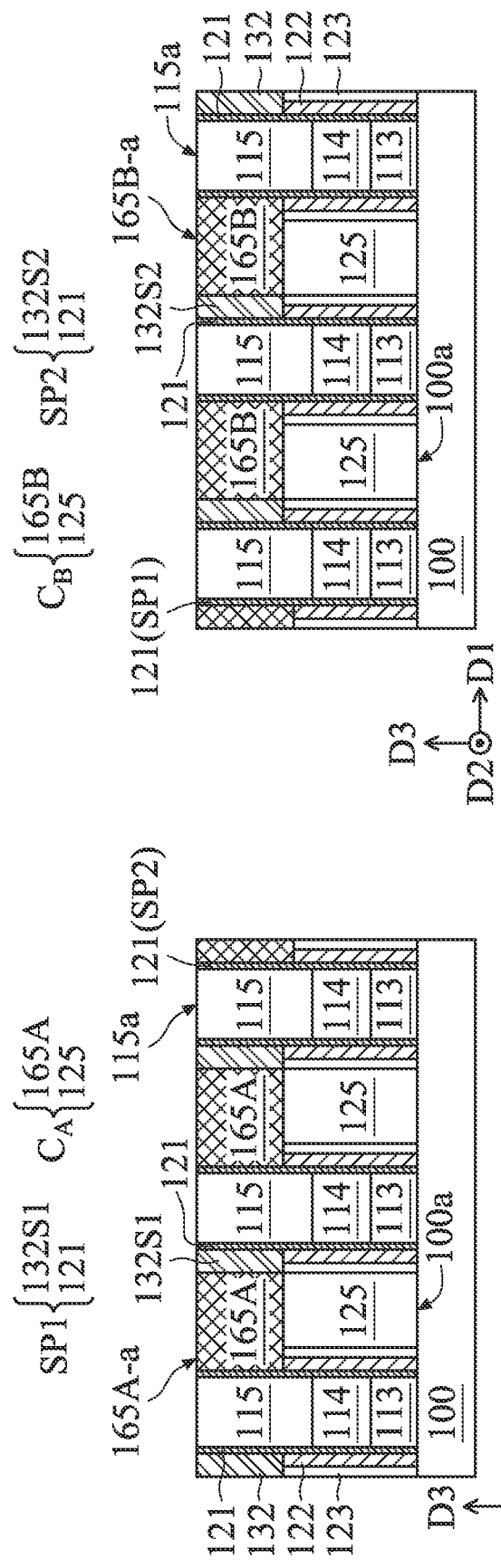
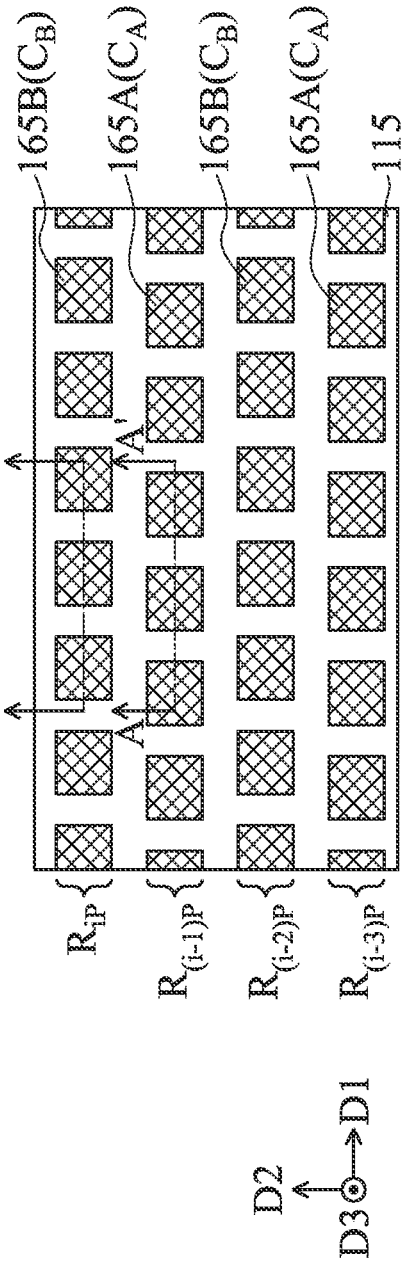
FIG. 15A
FIG. 15B
FIG. 15C

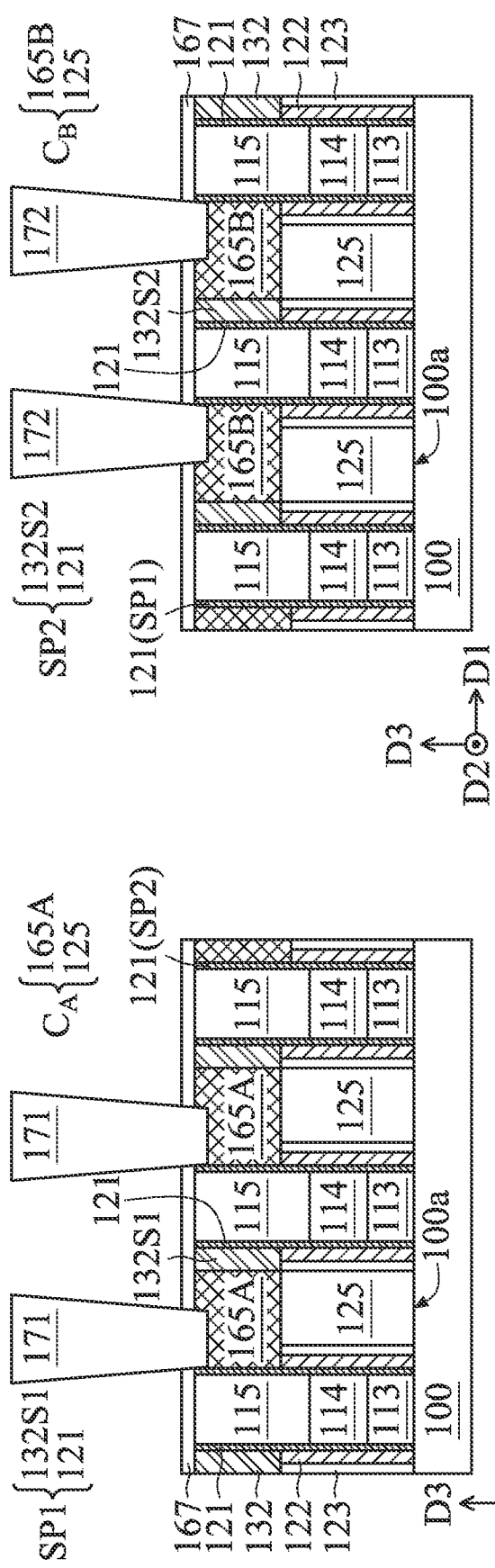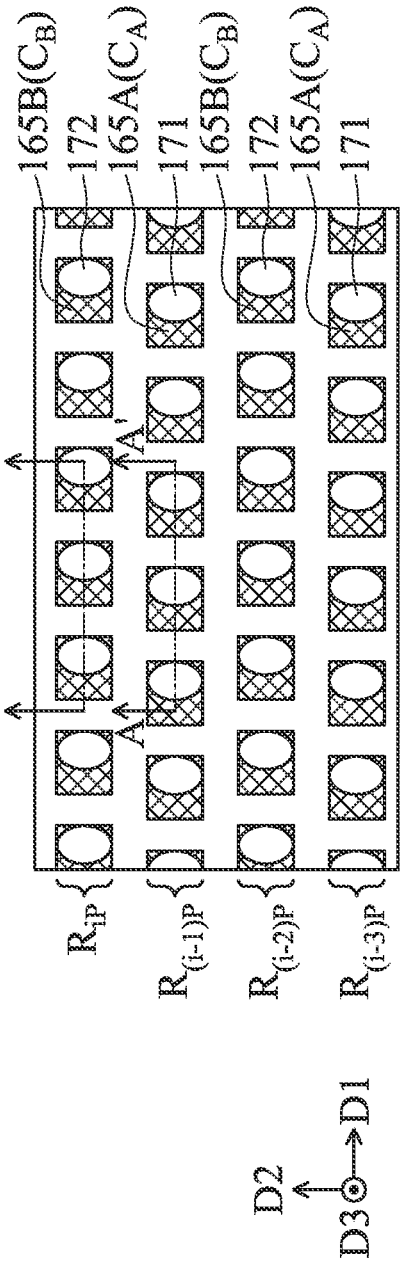
FIG. 16A
FIG. 16B
FIG. 16C

SEMICONDUCTOR STRUCTURE AND METHOD OF MANUFACTURING THE SAME

CROSS REFERENCE TO RELATED APPLICATIONS

This application claims the benefit of Taiwan Application No. 110100933, filed on Jan. 11, 2021, the disclosure of which is hereby incorporated by reference herein in its entirety.

BACKGROUND

Field of the Disclosure

The present disclosure relates to a semiconductor structure and its manufacturing method, and in particular, it relates to a semiconductor structure of dynamic random access memory (DRAM) and its manufacturing method.

Description of the Related Art

As semiconductor technology improves, the memory units used in dynamic random access memory (DRAM) devices are increasingly miniaturized, while the degree of integration of the memory units is increased to comply with consumer demand for miniaturized electronic devices. The development of the buried word line dynamic random access memory device was designed to satisfy the need to increase the degree of integration of dynamic random access memory devices, in order to accelerate the operating speed of the device. Furthermore, isolation structures (such as shallow trench isolation structures) may be developed further within the buried word line dynamic random access memory device, to prevent interference between word lines.

In conventional processes for forming dynamic random access memory devices, doping regions are formed within the active regions in the substrate, and the doping regions act as source regions and drain regions at two opposite sides of the bit lines. The memory device further includes contacts that electrically connect the surfaces of the source regions and drain regions. In a conventional dynamic random access memory device, pillar-like structures that include the contacts extending over the top surfaces of the bit lines and the contact plugs landing on the contacts are formed. Since the integration of memory devices continues to increase, the space between related components (such as bit lines, contacts and contact plugs) is also constantly shrinking. More accurate manufacturing processes (such as immersion lithography) are required to complete the semiconductor structure of the existing memory device. However, this also greatly increases the production cost.

SUMMARY

A semiconductor structure is provided. The semiconductor structure includes a substrate and several bit lines on the substrate. In some embodiments, each of the bit lines includes a first conductive layer on the substrate, a second conductive layer on the first conductive layer, and a hardmask layer on the second conductive layer. In some embodiments, the semiconductor structure also includes contacts disposed on the substrate and positioned between two adjacent bit lines. In some embodiments, the bottom surfaces of the contacts physically contact the substrate, and the top surfaces of the contacts are not higher than the top surfaces of the hardmask layers adjacent to the contacts. Also, each of the contacts includes a bottom contact part on the substrate and a top contact part on the bottom contact part, and a width of a top surface of the top contact part is greater than a width of a top surface of the bottom contact part.

A method of manufacturing a semiconductor structure is provided. The method includes providing a substrate and bit lines formed on the substrate. Also, a spacer material layer covers the sidewalls of the top surface of each of the bit lines. In some embodiments, each of the bit lines includes a conductive layer and a hardmask layer on the conductive layer. In some embodiments, the method also includes forming a first contact material layer on the substrate, wherein the first contact material layer covers the spacer material layers on the bit lines. In some embodiments, the method also includes etching the first contact material layer to remove a portion of the first contact material layer, a portion of the hardmask layers and a portion of the spacer material layers, thereby recessing the first contact material layer and forming the first recesses between the remaining portions of the hardmask layers, wherein the remaining portions of the first contact material layer form the bottom contact parts. In some embodiments, the method further includes depositing the first dielectric layer over the bottom contact parts, wherein the first dielectric layer is conformally formed on the sidewalls and the bottom surfaces of the first recesses and the top surfaces of the remaining portions of the hardmask layers. In some embodiments, the method also includes patterning the first dielectric layer to remove a portion of the first dielectric layer and expose the top surfaces of the bottom contact parts, thereby forming spacers with different thicknesses on two opposite sidewalls of the hardmask layers that protrude from the bottom contact parts. The second recesses are formed between two adjacent spacers, and the second recesses expose the top surfaces of the bottom contact parts. In some embodiments, the method further includes forming the top contact parts on the bottom contact parts, wherein the top surfaces of the top contact parts are not higher than the top surfaces of the hardmask layers adjacent to the top contact parts.

BRIEF DESCRIPTION OF THE DRAWINGS

FIGS. 1-4, 5A-5C, 6A, 6B, 7A-7C, 8A, 8B, 9A. 9B, 10A, 10B, 11A, 11B, 12A, 12B, 13A, 13B, 14A, 14B. 15A-15C, 16A-16C illustrate the cross-sectional views and the top views of intermediate stages in a method of manufacturing a semiconductor structure in an electronic, in accordance with some embodiments of the present disclosure,
  wherein
FIGS. 5C, 7C, 15C and 16C are top views of substrates of intermediate stages of a method of manufacturing the semiconductor structure, in accordance with some embodiments;
FIGS. 5A. 7A, 15A and 16A are cross-sectional views taken along sectional lines A-A' of the structures of FIGS. 5C, 7C, 15C and 16C, respectively;
and
FIGS. 5B, 7B, 15B and 16B are cross-sectional views taken along sectional lines B-B' of the structures of FIGS. 5C, 7C, 15C and 16C, respectively.

DETAILED DESCRIPTION

Figure 1:
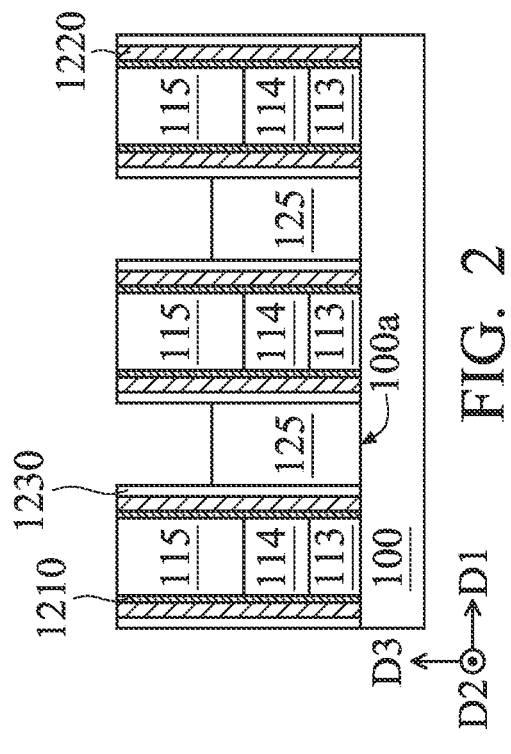

The present disclosure provides a semiconductor structure and a method of manufacturing the same, wherein the semiconductor structure includes contacts not protruding from the top surfaces of the bit lines. In the conventional method, the pillar-like structures that include the contacts extending over the top surfaces of the bit lines and the contact plugs landing on the contacts are formed. However, it requires complicated and expansive processes to form those pillar-like structures. Compared with the complicated and expansive conventional method for forming pillar-like structures, the semiconductor structure and the method of manufacturing the same as provided in accordance with some embodiments decrease the process complexity and save the production cost. Especially when the integration of memory devices continues to increase, the spacing between related components (such as bit lines, contacts and contact plugs) is also constantly shrinking. The manufacturing method provided in the embodiment does not require expensive manufacturing processes (such as immersion lithography) to complete the fabrication of semiconductor structures. According to some embodiments, the semiconductor structure and the method of manufacturing the same not only greatly decrease the manufacturing process cost, but also obtain the structure having components with complete profiles. Therefore, the semiconductor structure manufactured by the method of the embodiment has great electrical characteristics.

In addition, the semiconductor structure of the embodiment can be, for example, applied to a dynamic random access memory (DRAM) device for manufacturing the bit lines and the contacts of the memory device. For the sake of simplicity and clarity, three bit lines and two contacts on the substrate are illustrated in the drawings for describing the semiconductor structure in some embodiments of the present disclosure. However, the disclosure is not limited in those illustrating structures. In addition, active regions in the substrate can be defined by several isolation structures. Also, other components, such as buried word lines (i.e. the gate electrodes), are further formed in the substrate. For the sake of simplicity and clarity, those elements formed in the substrate 100 are omitted in the drawings.

FIGS. 1-4, 5A-5C, 6A, 6B, 7A-7C, 8A, 8B, 9A, 9B, 10A, 10B, 11A, 11B, 12A, 12B, 13A, 13B, 14A, 14B, 15A-15C, 16A-16C illustrate the cross-sectional views and the top views of intermediate stages in a method of manufacturing a semiconductor structure in an electronic, in accordance with some embodiments of the present disclosure. FIGS. 5C, 7C, 15C and 16C are top views of substrates of intermediate stages of a method of manufacturing the semiconductor structure, in accordance with some embodiments. FIGS. 5A, 7A, 15A and 16A are cross-sectional views taken along sectional lines A-A' of the structures of FIGS. 5C, 7C, 15C and 16C, respectively. FIGS. 5B, 7B, 15B and 16B are cross-sectional views taken along sectional lines B-B' of the structures of FIGS. 5C, 7C, 15C and 16C, respectively.

Referring to FIG. 1, a substrate 100 is provided, and several bit lines 116 are formed on the substrate 100. Also, examples of the elements formed in the substrate 100 include several isolation regions extending downwards from the surface of the substrate 100 to define active regions, several buried word lines separated from the bit lines 116, and an insulating layer in the substrate 100 for separating the bit lines 116 and word lines. For the sake of simplicity and clarity, those elements formed in the substrate 100 are omitted in the drawings. In some embodiments, the substrate 100 includes one or more semiconductor materials. For example, the substrate 100 may include silicon, gallium arsenide, gallium nitride, germanium silicide, another suitable substrate material, or a combination thereof. In some embodiments, the substrate 100 is a silicon-on-insulator (SOI) substrate.

As shown in FIG. 1, each of the bit lines 116 includes the first conductive layer 113 on the top surface 100a of the substrate 100, the second conductive layer 114 on the first conductive layer 113 and the hard mask (HM) layer 115 on the second conductive layer 114. The first conductive layer 113 includes an epitaxial material or polysilicon. The second conductive layer 114 may include a metal material (such as tungsten), and the hard mask layer 115 may include a nitride material (such as silicon nitride). However, the disclosure is not limited to the materials provided herein. In addition, those bit lines 116 are spaced apart from each other in the first direction D1 and extend in the second direction D2. The first conductive layer 113, the second conductive layer 114 and the hard mask layer 115 are stacked in the third direction D3. Also, the buried word lines (not shown) in the substrate 100 extend in the first direction D1.

In addition, spacer material layers cover the sidewalls of the bit lines 116 to protect the bit lines 116. As shown in FIG. 1, a first nitride material layer 12-1 is formed on the sidewalls of each of the bit lines 116, an oxide material layer 12-2 is formed on the outer sidewalls of the first nitride material layer 12-1, and a second nitride material layer 12-3 is formed on the oxide material layer 12-2. The second nitride material layer 12-3 is deposited on the outer sidewalls of the oxide material layer 12-2 and also covers the top surfaces of the first nitride material layer 12-1 and the hard mask layer 115. In each of the bit lines 116, the first nitride material layer 12-1 extends on the sidewalls of the hard mask layer 115, the second conductive layer 114 and the first conductive layer 113. Also, the first nitride material layer 12-1 and the second nitride material layer 12-3 may include (but not limited to) silicon nitride, and the oxide material layer 12-2 may include (but not limited to) silicon oxide.

As shown in FIG. 1, a first contact material layer 1250 is formed on the substrate 100 and covers the spacer material layers on the bit lines 116, wherein the first contact material layer 1250 fills the space between adjacent bit lines 116. In some embodiments, the first contact material layer 1250 covers the top surfaces and sidewalls of the spacer material layers around all of the bit lines 116, and also covers the exposed surface of the substrate 100 between the bit lines 116. As shown in FIG. 1, the top surface of the first contact material layer 1250 is higher than the top surfaces of the bit lines 116. The first contact material layer 1250 may include doped or undoped polysilicon, and can be formed on the substrate 100 by chemical vapor deposition. In some embodiments, after the patterning processes are performed subsequently, the first contact material layer 1250 will become a part of the contact (hereinafter referred as the bottom contact part).

Figure 2:
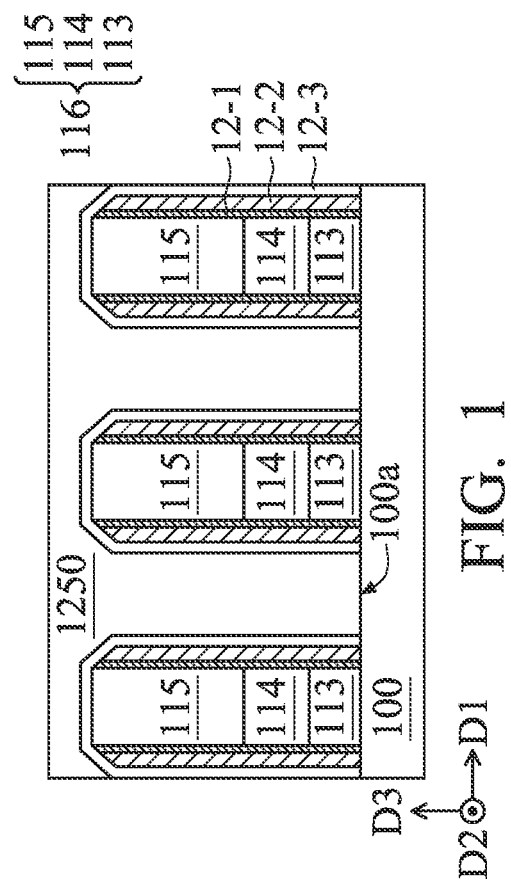

Next, referring to FIG. 2, a portion of the first contact material layer 1250 is removed to recess the first contact material layer 1250. The remaining portions of the first contact material layer 1250 form the bottom contact parts 125. In some embodiments, the portion of the first contact material layer 1250 can be removed by an etch back process. Also, in this etch back process, a portion of the hard mask layer 115 and portions of the spacer material layers (including a portion of the second nitride material layer 12-3, a portion of the oxide material layer 12-2 and a portion of the first nitride material layer 12-1). Therefore, after this etch back step is performed, the top surfaces of the remaining portions of the spacer material layers are substantially coplanar. Also, the top surfaces 125a of the bottom contact parts 125 are lower than the top surfaces of the remaining portions of the spacer material layers.

Figure 3:
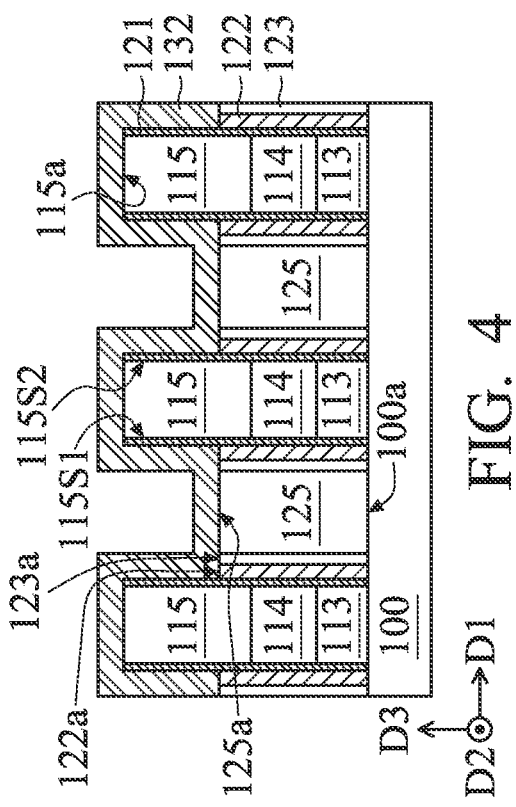

Next, referring to FIG. 3, the portions of the spacer material layers on the sidewalls of the hardmask layers 115 that protrude from the bottom contact parts 125 are removed. According to some embodiments, the portions of the second nitride material layer 12-3 and the oxide material layer 12-2 on the sidewalls of the hardmask layers 115 that protrude from the bottom contact parts 125 can be removed by a suitable wet etching process. Also, in some embodiments, the wet etching process may slightly damage the hard mask layers 115 and the bottom contact parts 125, which leads to material loss. Therefore, the heights of the bottom contact parts 125 and the hard mask layers 115 as shown in FIG. 3 would be slightly lower than the heights of the bottom contact parts 125 and the hard mask layers 115 as shown in FIG. 2.

As shown in FIG. 3, after the bottom contact parts 125 are formed followed by removing portions of the spacer material layers, the remaining portions of the hard mask layer 115 protrude from the top surfaces 125a of the bottom contact parts 125. The first nitride layers 121 as formed cover the sidewalls of the hard mask layers 115, the sidewalls of the second conductive layer 114 and the sidewalls of the first conductive layer 113. Also, the top surfaces of the oxide layers 122 and the top surfaces of the second nitride layers 123 are substantially level with the top surfaces 125a of the bottom contact parts 125. According to some embodiments, after the bottom contact parts 125 are formed followed by removing portions of the spacer material layers, the first recesses 131 are formed between remaining portions of the hard mask layers 115. Accordingly, the first recesses 131 expose the top surfaces 125a of the bottom contact parts 125, the top surfaces 122a of the oxide layers 122 and the top surfaces 123a of the second nitride layers 123.

In addition, as shown in FIG. 3, in each of the bit lines 116, the portions of the hard mask layer 115 that protrude from the top surfaces 125a of the bottom contact parts 125 have the first sidewalls 115S1 and the second sidewalls 115S2 opposite to the first sidewalls 115S1. In this stage, the first nitride layers 121 having the same thickness are formed on the first sidewalls 115S1 and the second sidewalls 115S2 of the hard mask layers 115. In the subsequent processes, the spacers having different thicknesses are formed on the opposite sidewalls of the hard mask layers 115 that protrude from the top surfaces 125a of the bottom contact parts 125. Therefore, two opposite sidewalls of the top contact parts formed subsequently contact the spacers having different thicknesses. Thus, according to the embodiments of the disclosure, the positions of the top contact parts of the adjacent rows are staggered by changing and adjusting the thickness of the spacers, so that the positions of the contact plugs that are connected to the underlying top contact parts can be misaligned with each other.

Figure 4:
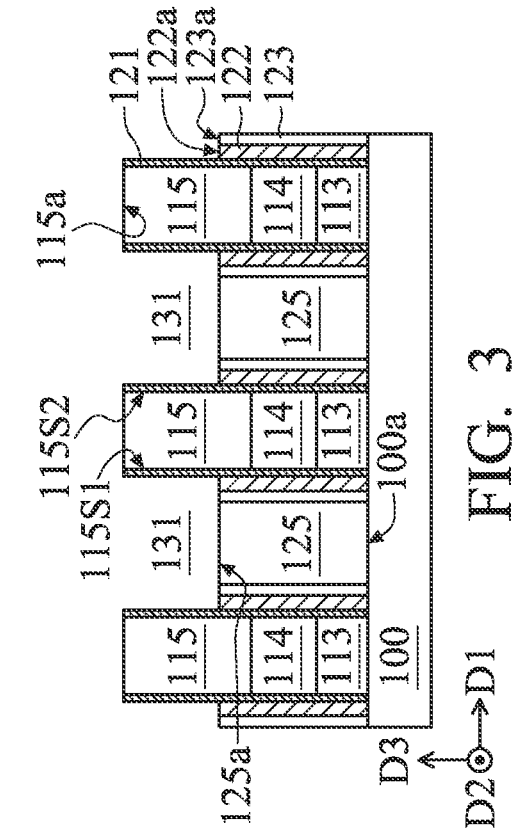

Next, referring to FIG. 4, a first dielectric layer 132 is conformally deposited over the bottom contact parts 125 to cover the sidewalls and bottom surfaces of the first recesses 131. That is, the first dielectric layer 132 is conformally formed to cover the top surfaces 115a, the first sidewalls 115S1 and the second sidewalls 115S2 of the hardmask layers 115. Also, the first dielectric layer 132 further covers the top surface 122a of the oxide layers 122, the top surfaces 123 of the second nitride layers 123 and the top surfaces 125a of the bottom contact parts exposed by the first recesses 131. In some embodiments, the first dielectric layer 132 has a sufficient thickness to cover at least the top surfaces 122a of the oxide layers 122 and the top surfaces 123a of the second nitride layers 123. In some embodiments, the thickness of the first dielectric layer 132 is (but not limited to) within a range of about 5 nm to about 7 nm.

In addition, the first dielectric layer 132 is a nitride-containing layer, such as a silicon nitride layer. However, the present disclosure is not limited to the material provided herein. The first dielectric layer 132 may include one or more dielectric materials. In some embodiments, the first dielectric layer 132 and the first nitride layer 121 include the same material. The first dielectric layer 132 can be formed by deposition, such as chemical vapor deposition or another suitable deposition method.

Next, a patterning process is performed on the first dielectric layer 132, so that the spacers with different thicknesses can be formed on two opposite sidewalls of the hardmask layers that protrude from the bottom contact parts. Also, for the spacers on the sidewalls of the hardmask layers that are adjacent to the first recesses 131 positioned in adjacent rows, the thickness arrangements of the spacers are different, so that the positions of the subsequently formed top contact parts in adjacent rows can be misaligned with each other. FIG. 5A to FIG. 14B illustrate one of the methods of patterning the first dielectric layer 132, in accordance with some embodiments of the present disclosure.

Figure 5A:
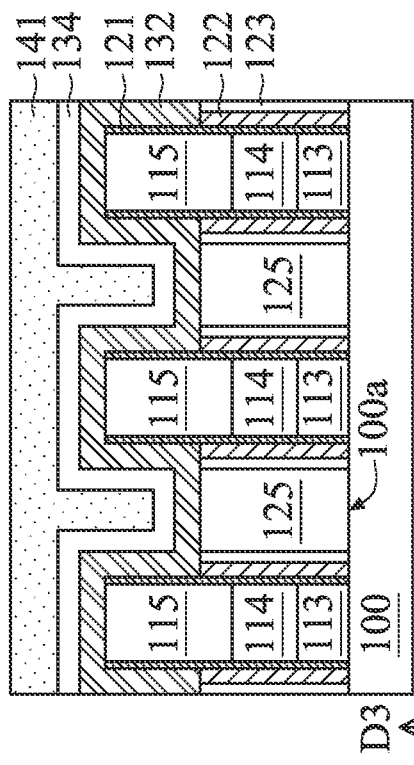
Figure 5B:
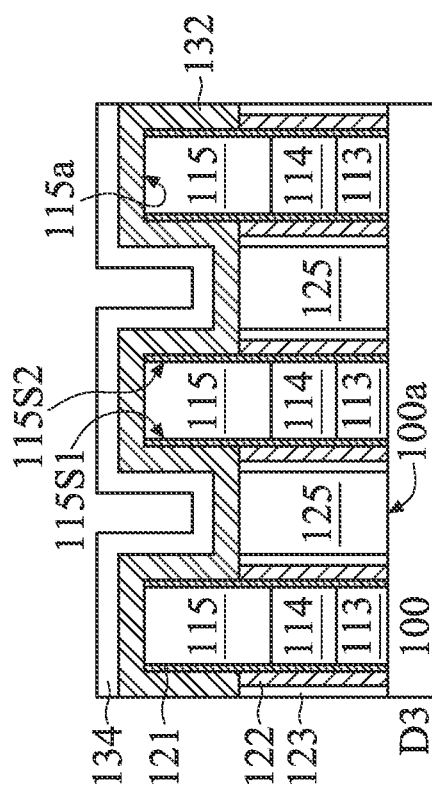
Figure 5C:
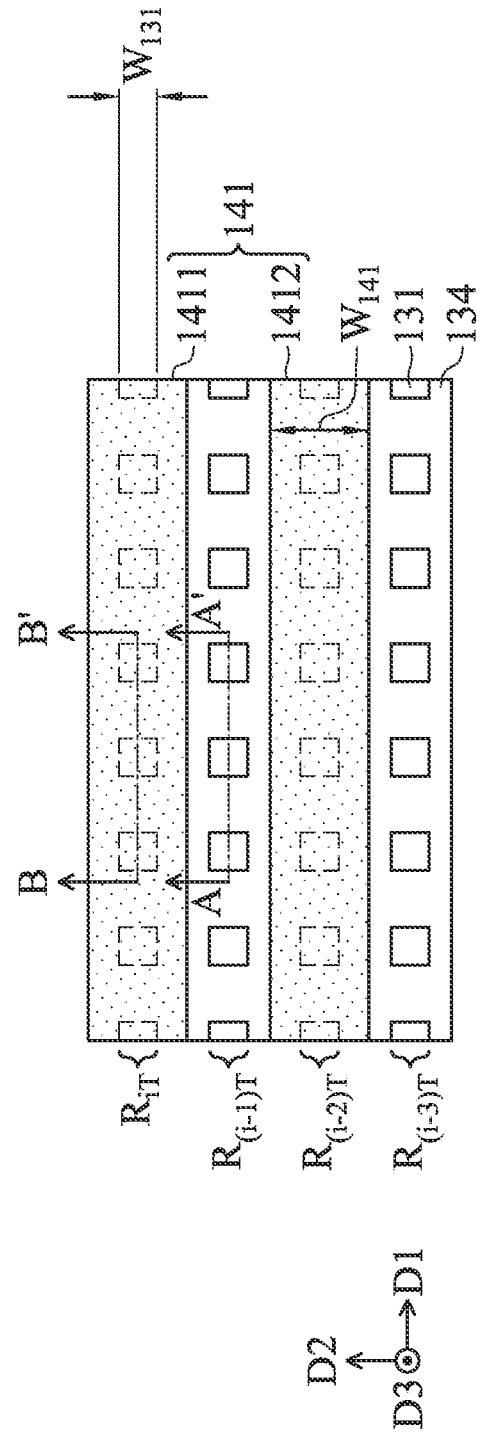

Referring to FIGS. 5A, 5B and 5C. After the first dielectric layer 132 is formed (FIG. 4), an etching barrier layer 134 is conformally deposited on the first dielectric layer 132, and a patterned mask layer (such as a patterned photoresist layer) is provided on the etching barrier layer 134 to cover parts of the first recess 131 (FIG. 3). In some embodiments, the etching barrier layer 134 is an undoped polysilicon layer, or another suitable barrier material.

As shown in FIG. 5C, the first recesses 131 are arranged along the first direction D1 to form several rows, and those rows are spaced apart from each other in the second direction D2. For the sake of simplicity and clarity, four rows of the first recess 131 are depicted in FIG. 5C for illustration. The first recesses 131 are arranged as the first recesses 131 of the i-th row $R_{iT}$, the first recesses 131 of the (i−1)-th row $R_{(i-1)T}$, the first recesses 131 of the (i−2)-th row $R_{(i-2)T}$ and the first recesses 131 of the (i−3)-th row $R_{(i-3)T}$, wherein i is a positive integer.

As shown in FIG. 5B and FIG. 5C, in some embodiments, the first photoresist pattern 141 is provided on the first recesses 131 of the i-th row $R_{iT}$ and the first recesses 131 of the (i−2)-th row $R_{(i-2)T}$. The first photoresist pattern 141 exposes the etching barrier layer 134 in the first recesses 131 of the (i−1)-th row $R_{(i-1)T}$ and the first recesses 131 of the (i−3)-th row $R_{(i-3)T}$, as shown in FIG. 5A and FIG. 5C.

In some embodiments, the first photoresist pattern 141 includes several photoresist strips, such as the first photoresist strip 1411 covering the etching barrier layer 134 corresponding to the first recesses 131 of the i-th row $R_{iT}$ and another first photoresist strip 1412 covering the etching barrier layer 134 corresponding to the first recesses 131 of the (i−2)-th row $R_{(i-2)T}$. It should be noted that the width $W_{41}$ of the first photoresist strip 1411/1412 in the second direction D2 is greater than the width $W_1$ of the first recess 131 in the second direction D2. For example, the width $W_{141}$ of the first photoresist strip 1411/1412 may be equal to the sum of the width $W_{131}$ of the first recess 131 and part of the distance between the first recesses in adjacent rows, as shown in FIG. 5C. Therefore, the subsequent lithography processes can be performed by using a typical lithography and the first photoresist pattern 141 having the first photoresist strips 1411 and 1412 with greater widths provided herein. Thus, whether using immersion lithography (a photolithography resolution enhancement technique) or a general photoresist with a typical photolithography process, the subsequent processes can be completed using the manufacturing method of the embodiment and the first photoresist pattern 141.

Figure 6A:
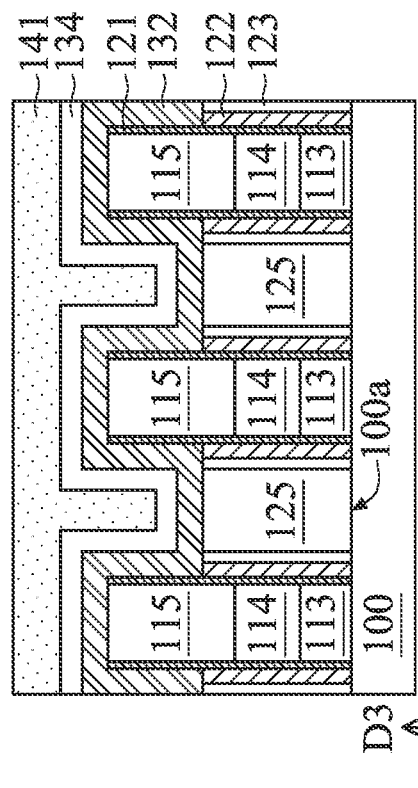
Figure 6B:
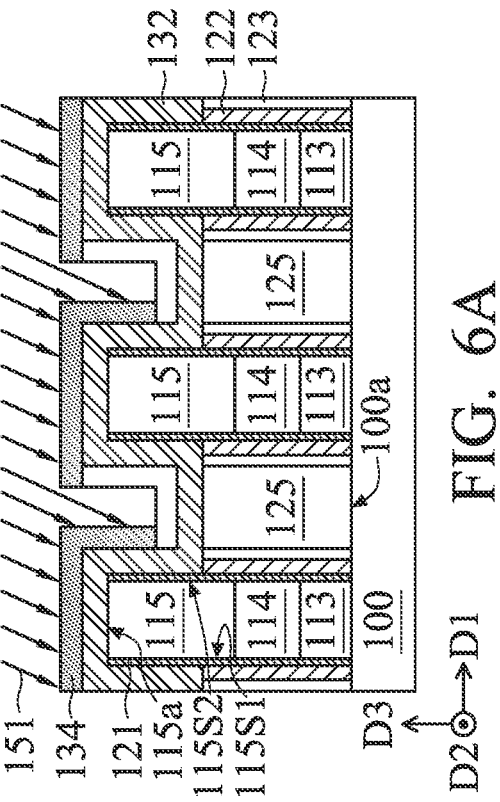

Next, referring to FIG. 6A and FIG. 6B, a first implant step 151 is performed on the portions of the etching barrier layer 134 on the first recesses 131 of the (i−1)-th row $R_{(i-1)T}$ and the (i−3)-th row $R_{(i-3)T}$ that are exposed by the first photoresist pattern 141. According to some embodiments, the first implant step 151 is performed on the exposed portions of the etching barrier layer 134 at an angle to introduce the dopants of a suitable conductivity type, such as P-type dopants (e.g. boron or another suitable doping material). As shown in FIG. 6A, the positions of the implanted portions of the exposed etching barrier layer 134 correspond to the second sidewalls 115S2 and the top surfaces 115a of the hard mask layer 115. As shown in FIG. 6B, the portions of the etching barrier layer 134 that are covered by the first photoresist pattern 141 are not implanted by any dopant.

After the first implant step 151 is completed, the first photoresist pattern 141 is removed. In some embodiments, the first photoresist pattern 141 is removed by an ashing process.

Figure 7A:
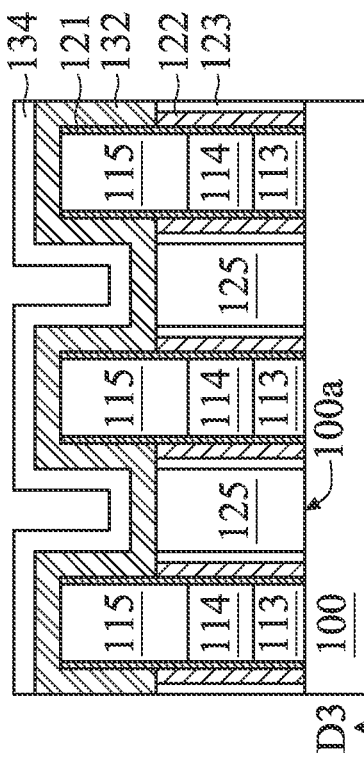
Figure 7B:
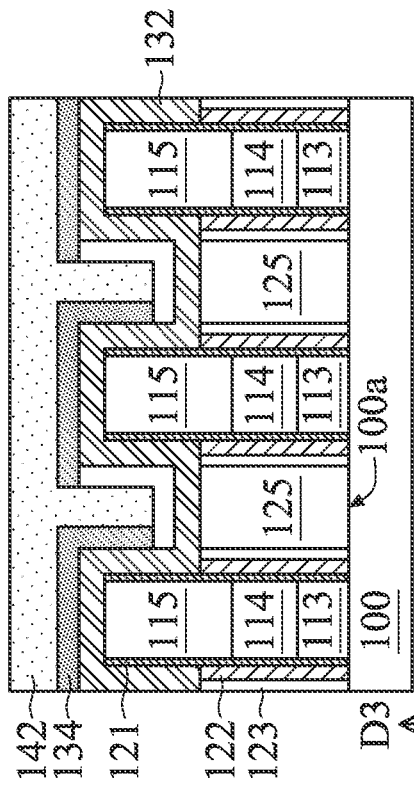
Figure 7C:
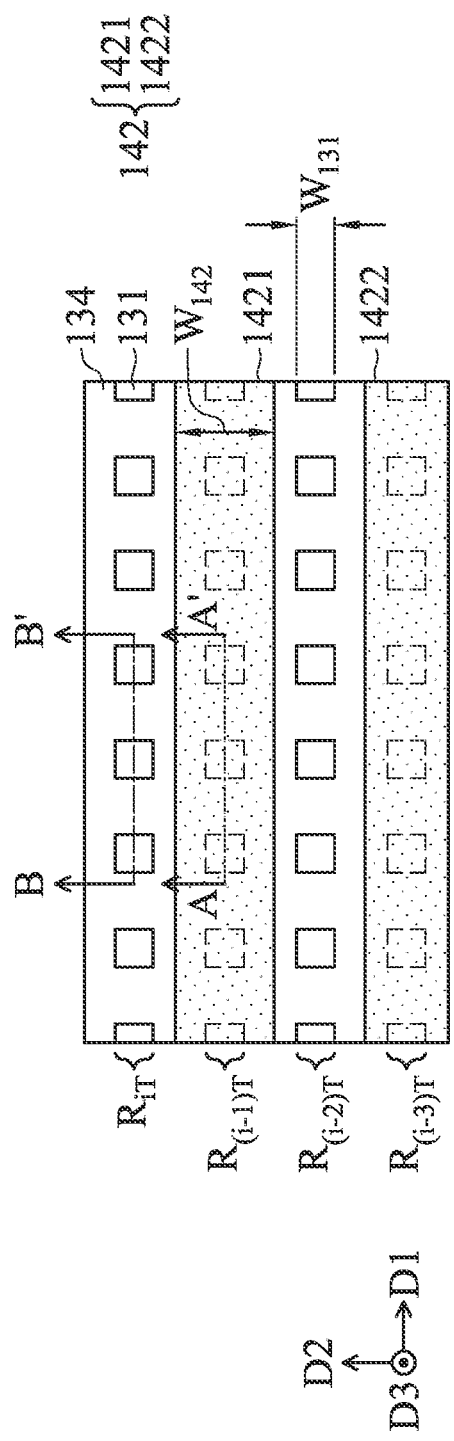

Next, referring to FIGS. 7A, 7B and 7C, in some embodiments, the second photoresist pattern 142 is provided on the first recesses 131 of the (i−1)-th row $R_{(i-1)T}$ and the first recesses 131 of the (i−3)-th row $R_{(i-3)T}$. The second photoresist pattern 142 exposes the etching barrier layer 134 in the first recesses 131 of the i-th row $R_{iT}$ and the first recesses 131 of the (i−2)-th row $R_{(i-2)T}$, as shown in FIG. 7B and FIG. 7C.

In some embodiments, the second photoresist pattern 142 includes several photoresist strips, such as the second photoresist strip 1421 covering the etching barrier layer 134 corresponding to the first recesses 131 of the (i−1)-th row $R_{(i-1)T}$ and another second photoresist strip 1422 covering the etching barrier layer 134 corresponding to the first recesses 131 of the (i−3)-th row $R_{(i-3)T}$. As shown in FIG. 7C, according to some embodiments, the width $W_{142}$ of the second photoresist strip 1421/1422 in the second direction D2 is greater than the width Win of the first recess 131 in the second direction D2. For example, the width $W_{142}$ of the second photoresist strip 1421/1422 may be equal to the sum of the width $W_{131}$ of the first recess 131 and part of the distance between two first recesses in adjacent rows, as shown in FIG. 7C. Therefore, the subsequent lithography processes can be performed by using a typical lithography and the second photoresist pattern 142 having the second photoresist strips 1421 and 1422 with greater widths provided herein. Thus, whether using immersion lithography (a photolithography resolution enhancement technique) or a general photoresist with a typical photolithography process, the subsequent processes can be completed using the manufacturing method of the embodiment and the second photoresist pattern 142.

Figure 8B:
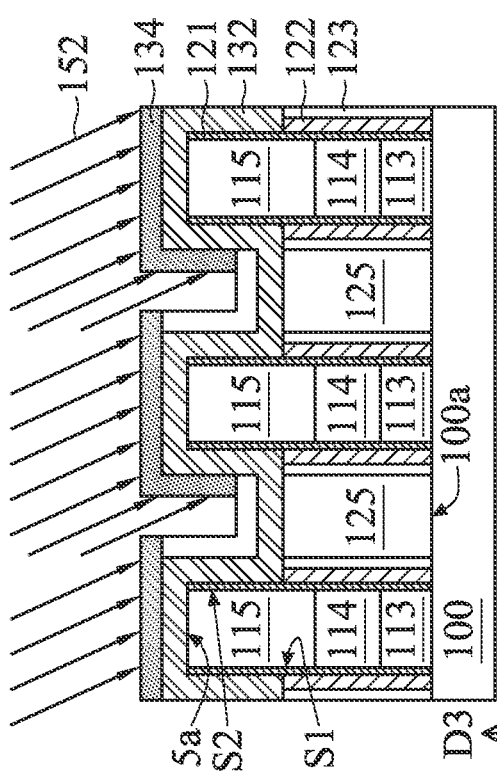
Figure 8A:
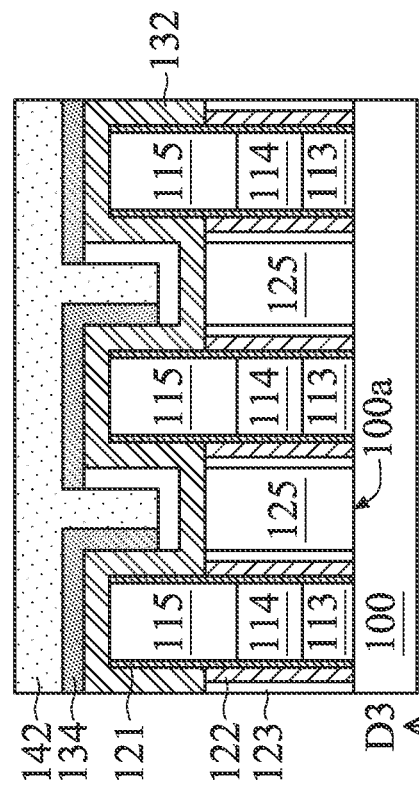

Next, referring to FIG. 8A and FIG. 8B, a second implant step 152 is performed on the portions of the etching barrier layer 134 on the first recesses 131 of the i-th row $R_{iT}$ and the (i−2)-th row $R_{(i-2)T}$ that are exposed by the second photoresist pattern 142. Also, the implanting angle of the second implant step 152 is different from the implanting angle of the first implant step 151. According to some embodiments, the second implant step 152 is performed on the exposed portions of the etching barrier layer 134 at another angle which is different from the angle of the first implant step 151, thereby introducing the dopants of a suitable conductivity type, such as P-type dopants (e.g. boron or another suitable doping material). As shown in FIG. 8A, the portions of the etching barrier layer 134 that are covered by the second photoresist pattern 142 are not implanted by any dopant. As shown in FIG. 8B, the positions of the implanted portions of the exposed etching barrier layer 134 correspond to the first sidewalls 115S1 and the top surfaces 115a of the hard mask layers 115.

Figure 9A:
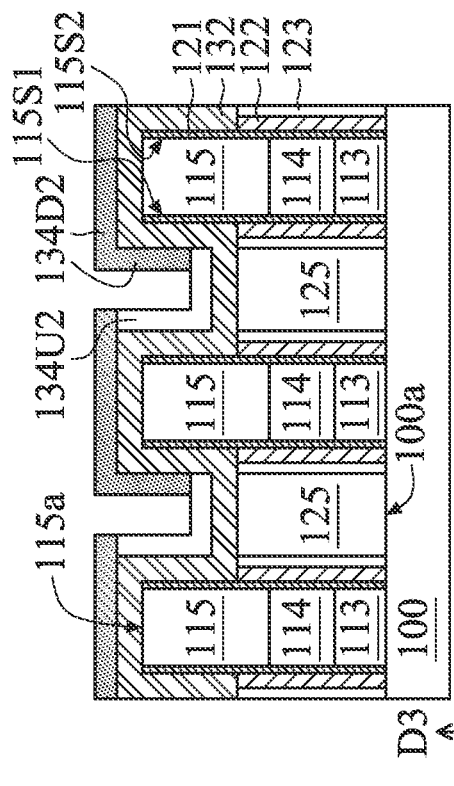
Figure 9B:
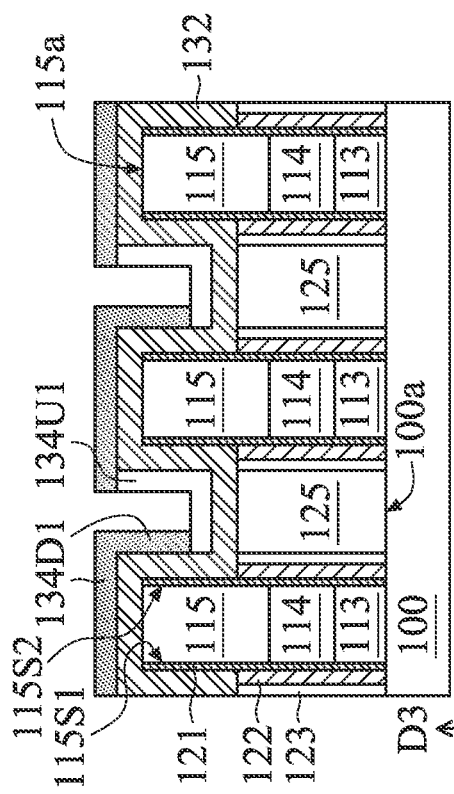

Next, after the second implant step 152 is completed, the second photoresist pattern 142 is removed, as shown in FIG. 9A and FIG. 9B. In some embodiments, the second photoresist pattern 142 is removed by an ashing process.

As shown in FIG. 9A, the first implanted portions 134D1 of the etching barrier layer 134 are formed at the positions corresponding to the first recesses 131 of the (i−1)-th row $R_{(i-1)T}$ and the (i−3)-th row $R_{(i-3)T}$. The first implanted portions 134D1 of the etching barrier layer 134 are formed at the positions corresponding to the second sidewalls 115S2 of the hard mask layers 115. Also, the first implanted portions 134D1 of the etching barrier layer 134 are formed on the portions of the first dielectric layer 132 that corresponds to the top surfaces 115a of the hard mask layers 115. The other portions of the etching barrier layer 134 that correspond to the first recesses 131 of the (i−1)-th row $R_{(i-1)T}$ and the (i−3)-th row $R_{(i-3)T}$ are not implanted and can be referred as the first non-implanted portions 134U1.

As shown in FIG. 9B, the second implanted portions 134D2 of the etching barrier layer 134 are formed at the positions corresponding to the first recesses 131 of the i-th row $R_{iT}$ and the (i−2)-th row $R_{(i-2)T}$. The second implanted portions 134D2 of the etching barrier layer 134 are formed at the positions corresponding to the first sidewalls 115S1 of the hard mask layers 115. Also, the second implanted portions 134D2 of the etching barrier layer 134 are formed on the portions of the first dielectric layer 132 that correspond to the top surfaces 115a of the hard mask layers 115. The other portions of the etching barrier layer 134 that correspond to the first recesses 131 of the i-th row $R_{iT}$ and the (i−2)-th row $R_{(i-2)T}$ are not implanted and can be referred as the second non-implanted portions 134U2.

Figure 10A:
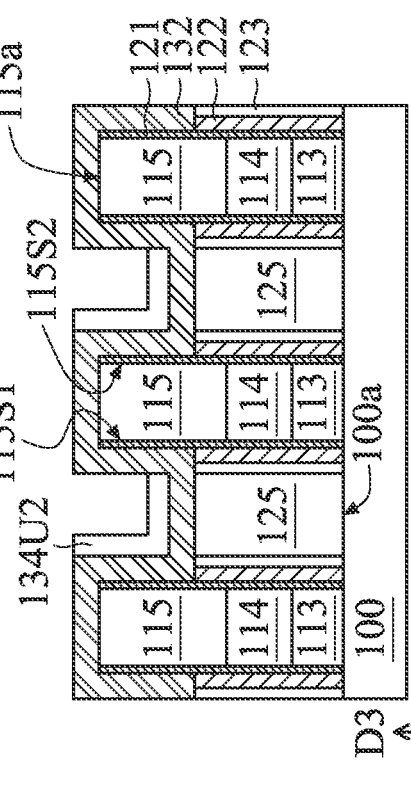
Figure 10B:
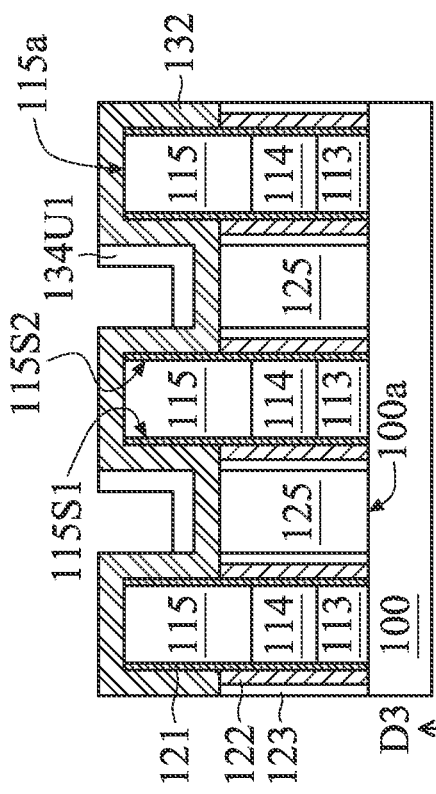

Next, referring to FIG. 10A and FIG. 10B, the implanted portions of the etching barrier layer 134 are removed, while the non-implanted portions of the etching barrier layer 134 are remained. In some embodiments, the first implanted portions 134D1 and the second implanted portions 134D2 of the etching barrier layer 134 (such as a polysilicon layer) are removed by a wet etching process. The first non-implanted portions 134U1 (as shown in FIG. 10A) and the second non-implanted portions 134U2 (as shown in FIG. 10B) remain on the first dielectric layer 132.

As shown in FIG. 10A, the remaining portions (i.e. the first non-implanted portion 134U1) of the etching barrier layer 134 correspond to the first recesses 131 of the (i−1)-th row $R_{(i-1)T}$ and the (i−3)-th row $R_{(i-3)T}$. Also, the remaining portions (i.e. the first non-implanted portion 134U1) of the etching barrier layer 134 expose the portions of the first dielectric layer 132 that correspond to the second sidewalls 115S2 and the top surfaces 115a of the hard mask layers 115. As shown in FIG. 10B, the remaining portions (i.e. the second non-implanted portion 134U2) of the etching barrier layer 134 correspond to the first recesses 131 of the i-th row $R_{iT}$ and the (i−2)-th row $R_{(i-2)T}$. Also, the remaining portions (i.e. the second non-implanted portion 134U2) of the etching barrier layer 134 expose the portions of the first dielectric layer 132 that correspond to the first sidewalls 115S1 and the top surfaces 115a of the hard mask layers 115.

Next, referring to FIG. 11A and FIG. 11B, parts of the first dielectric layer 132 that are uncovered by the non-implanted portions of the etching barrier layer 134 (i.e. the first non-implanted portion 134U1 and the second non-implanted portion 134U2) are removed. In some embodiments, these parts of the first dielectric layer 132 are removed by wet etching and/or another suitable method (such as a SiCoNi etching method). Therefore, as shown in FIG. 11A, the sidewall portions 132S1 of the first dielectric layer 132 are formed in the first recesses 131 of the (i−1)-th row $R_{(i-1)T}$ and the (i−3)-th row $R_{(i-3)T}$ after the portions of the first dielectric layer 132 that correspond to the second sidewalls 115S2 and the top surfaces 115a of the hard mask layers 115 are removed. In addition, as shown in FIG. JI B, the sidewall portions 132S2 of the first dielectric layer 132 are formed in the first recesses 131 of the i-th row $R_{iT}$ and the (i−2)-th row $R_{(i-2)T}$ after the portions of the first dielectric layer 132 that correspond to the first sidewalls 115S1 and the top surfaces 115a of the hard mask layers 115 are removed.

Next, referring to FIG. 12A and FIG. 12B, all of the portions of the etching barrier layer 134 remaining on the first dielectric layer 132 are removed. For example, the first non-implanted portion 134U1 in FIG. 11A and the second non-implanted portion 134U2 in FIG. 1I B are removed. In some embodiments, the etching barrier layer 134 is a polysilicon layer. In one example, the etching barrier layer 134 is removed using an etching gas (such as sulfur hexafluoride; $SF_6$) with a high selectivity to polysilicon.

As shown in FIG. 12A, in the first recesses 131 of the (i−1)-th row $R_{(i-1)T}$ and the (i−3)-th row $R_{(i-3)T}$, the sidewall portions 132S1 of the first dielectric layer 132 remain on the first sidewalls 115S1 of the hard mask layers 115, and the bottom portions 132B1 of the first dielectric layer 132 remain on the top surfaces 125a of the bottom contact parts 125. Also, as shown in FIG. 12B, in the first recesses 131 of the i-th row $R_{iT}$ and the (i−2)-th row $R_{(i-2)T}$, the sidewall portions 132S2 of the first dielectric layer 132 remain on the second sidewalls 115S2 of the hard mask layers 115, and the bottom portions 132B2 of the first dielectric layer 132 remain on the top surfaces 125a of the bottom contact parts 125.

In the subsequent process, the portions of the first dielectric layer 132 in the bottoms of the first recesses 131 are removed to expose the top surfaces 125a of the bottom contact parts 125, in accordance with some embodiments. FIGS. 13A, 13B, 14A and 14B illustrate one of the methods for removing the portions of the first dielectric layer 132 in the bottoms of the first recesses 131, in accordance with some embodiments of the present disclosure.

Figure 13A:
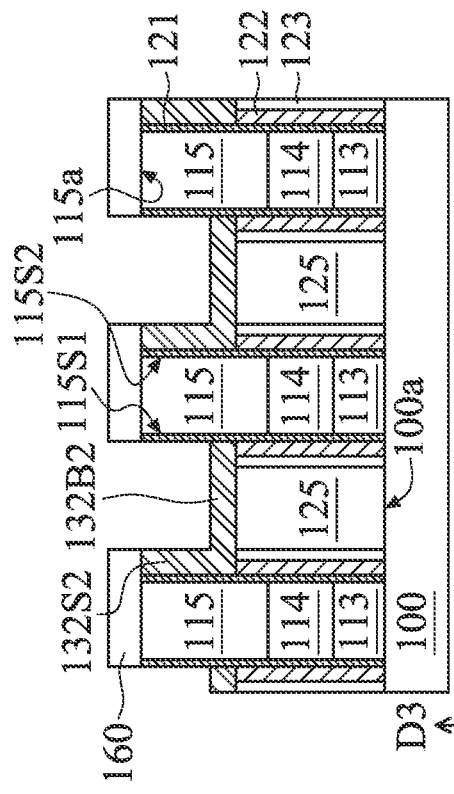
Figure 13B:
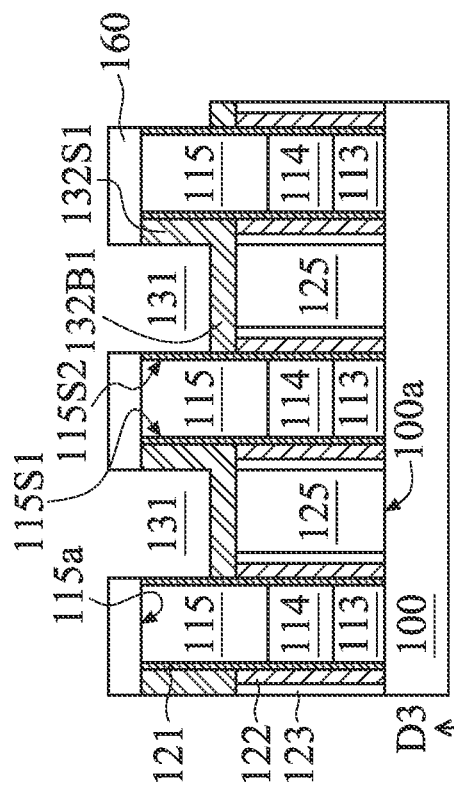

Referring to FIG. 13A and FIG. 13B, a protective pattern 160 is formed on the hard mask layers 115, thereby exposing the portions of the first dielectric layer 132 in the bottoms of the first recesses 131. In some embodiments, a polymer material layer or another suitable material layer is deposited on the structure as shown in FIG. 12A and FIG. 12B using methane ($CH_4$) as the deposition gas, followed by a suitable patterning process to form the protective pattern 160 as shown in FIG. 13A and FIG. 13B.

As shown in FIG. 13A, in the first recesses 131 of the (i−1)-th row $R_{(i-1)T}$ and the (i−3)-th row $R_{(i-3)T}$ the protective pattern 160 covers the top surfaces 115a of the hard mask layers 115, the first nitride layers 121 on the second sidewalls 115S2 of the hard mask layers 115, the first nitride layers 121 on the first sidewalls 115S1 of the hard mask layers 115, and the sidewall portions 132S1 of the first dielectric layer 132 (on the first sidewalls 115S1 of the hard mask layers 115).

As shown in FIG. 13B, in the first recesses 131 of the i-th row $R_{iT}$ and the (i−2)-th row $R_{(i-2)T}$, the protective pattern 160 covers the top surfaces 115a of the hard mask layers 115, the first nitride layers 121 on the first sidewalls 115S1 of the hard mask layers 115, the first nitride layers 121 on the second sidewalls 115S2 of the hard mask layers 115, and the sidewall portions 132S2 of the first dielectric layer 132 (on the second sidewalls 115S2).

Figure 14A:
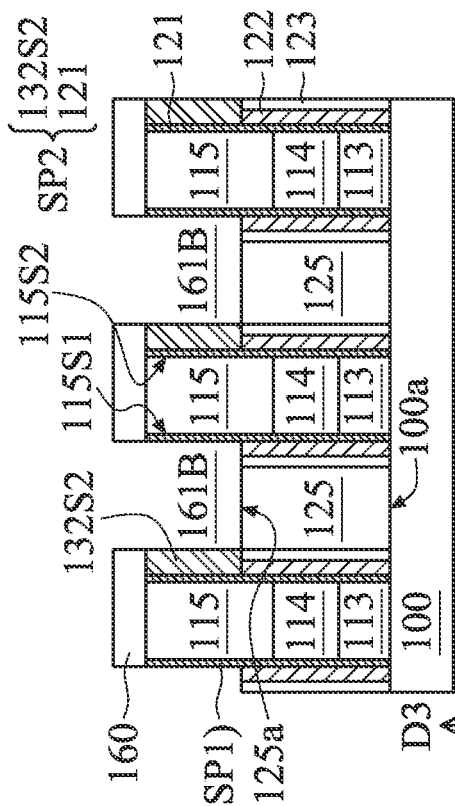
Figure 14B:
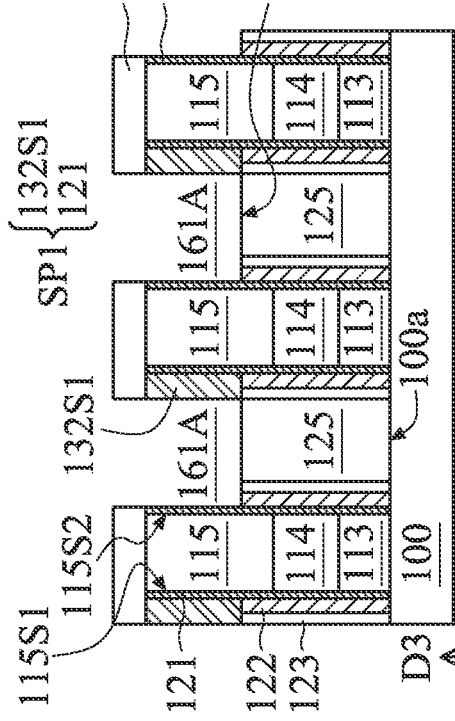

Next, referring to FIG. 14A and FIG. 14B, the removal of the portions of the first dielectric layer 132 in the bottoms of the first recesses 131 is performed to expose the top surfaces 125a of the bottom contact parts 125. In some embodiments, the bottom portions 132B1 and 132B2 of the first dielectric layer 132 are removed by an etching process with a higher selectivity for the material of the first dielectric layer 132 than for the material of the protective pattern 160.

As shown in FIG. 14A, the bottom portions 132B1 (FIG. 13A) of the first dielectric layer 132 in the first recesses 131 of the (i−1)-th row $R_{(i-1)T}$ and the (i−3)-th row $R_{(i-3)T}$ are removed, thereby exposing the top surfaces 125a. In some embodiments, after the bottom portions 132B1 are removed, the top surfaces 122a of the oxide layers 122 and the top surfaces 123a of the second nitride layer 123 that are close to the second sidewalls 115S2 of the hard mask layers 115 are also exposed.

Moreover, the bottom portions 132B2 (FIG. 13B) of the first dielectric layer 132 in the first recesses 131 of the i-th row $R_{iT}$ and the (i−2)-th row $R_{(i-2)T}$ and the bottom portions 132B1 (FIG. 13A) of the first dielectric layer 132 in the first recesses 131 of the (i−1)-th row $R_{(i-1)T}$ and the (i−3)-th row $R_{(i-3)T}$ can be removed simultaneously. As shown in FIG. 14B, the bottom portions 132B2 (FIG. 13B) are removed, thereby exposing the top surfaces 125a. In some embodiments, after the bottom portions 132B2 of the first dielectric layer 132 are removed, the top surfaces 122a of the oxide layers 122 and the top surfaces 123a of the second nitride layer 123 that are close to the first sidewalls 115S1 of the hard mask layers 115 are also exposed.

Next, after the top surfaces 125a of the bottom contact parts 125 are exposed, the protective pattern 160 is removed. In some embodiments, the protective pattern 160 is removed by an ashing process, or another suitable process.

The spacers with different thicknesses (such as the first spacers SP1 in FIG. 14A and the second spacers SP2 in FIG. 14B) can be formed through the above-mentioned processes as illustrated in FIGS. 5A-14B, wherein the spacers are formed on the two opposite sidewalls of the hard mask layer 115 that protrude from the top surfaces 125a of the bottom contact parts 125. Also, the second recesses 161A and 161B are formed between the spacers. According to the embodiments, in the top view of the bottom contact parts 125 on the substrate 100, the exposed top surfaces 125a in the second recesses 161A and the second recesses 161B are misaligned in the second direction D2. It should be noted that the present disclosure is not limited to the processes as illustrated in FIGS. 5A-14B. Other methods for forming spacers of different thicknesses on two opposite sidewalls of each of the hard mask layers 115 are also included in the present disclosure.

As shown in FIG. 14A, the first spacers SP1 are formed adjacent to the second recesses 161A in the (i−1)-th row $R_{(i-1)T}$ and the (i−3)-th row $R_{(i-3)T}$. Each of the first spacers SP1 includes the first nitride layer 121 on the first sidewall 115S1 of the hard mask layer 115 and the sidewall portion 132S1 of the first dielectric layer 132. The first nitride layers 121 on the second sidewalls 115S2 of the hard mask layers 115 can be referred as the second spacers SP2. In the example shown in FIG. 14A, the thickness of each of the first spacers SP1 is greater than the thickness of each of the second spacers SP2.

As shown in FIG. 14B, the first spacers SP1 are formed adjacent to the second recesses 161B in the i-th row $R_{iT}$ and the (i–2)-th row $R_{(i-2)T}$. The first nitride layers 121 on the first sidewalls 115S1 of the hard mask layers 115 can be referred as the first spacers SP1. Each of the second spacers SP2 includes the first nitride layer 121 on the second sidewalls 115S2 of the hard mask layer 115 and the sidewall portion 132S1 of the first dielectric layer 132. In the example shown in FIG. 14B, the thickness of each of the first spacers SP1 is less than the thickness of each of the second spacers SP2.

Referring to FIGS. 15A, 15B and 15C, several contacts $C_A$ and $C_B$ are formed on the substrate 100. FIG. 15C is a top view of the substrate 100. FIGS. 15A and 15B are cross-sectional views taken along sectional lines A-A' and B-B' of the structure of FIG. 15C. After the structures as shown in FIGS. 14A and 14B are formed, the top contact parts 165A are formed in the second recesses 161A (FIG. 15A), and the top contact parts 165B are formed in the second recesses 161B (FIG. 15B). As shown in FIG. 15A, the top contact parts 165A are formed on the bottom contact parts 125. Each of the top contact parts 165A and the underlying bottom contact part 125 are referred as a contact $C_A$. As shown in FIG. 15B, the top contact parts 165B are formed on the bottom contact parts 125. Each of the top contact parts 165B and the underlying bottom contact part 125 are referred as a contact $C_B$. As shown in FIG. 15C, in the top view of the substrate 100, those top contact parts 165A and 165B are arranged as the top contact parts 165B of the i-th row $R_{iP}$, the top contact parts 165A of the (i–1)-th row $R_{(i-1)P}$, the top contact parts 165B of the (i–2)-th row $R_{(i-2)P}$, and the top contact parts 165A of the (i–3)-th row $R_{(i-3)P}$, wherein i is a positive integer. In addition, the top contact parts 165A (or the contacts $C_A$) and the top contact parts 165B (or the contacts $C_B$) in adjacent rows are misaligned with each other in the second direction D2.

One of the methods for forming the top contact parts 165A and 165B is provided below. A second contact material layer is formed on the bottom contact parts 125. The second contact material layer covers the top surfaces 115a of the hard mask layers 115 and fills the second recesses 161A and 161B (FIG. 14A and FIG. 14B). The second contact material layer may include one or more metal materials, such as (but not limited to) tungsten. Next, the excess portions of the second contact material layer (i.e. the portions outside the second recesses 161A and 161B) are removed, and the remaining portions in the second recesses 161A and 161B form the top contact parts 165A and 165B, respectively.

It should be noted that the top surfaces 165A-a and 165B-a of the top contact parts 165A and 165B are not higher than top surfaces 115a of the hardmask layers 115 adjacent to the top contact parts 165A and 165B. That is, the contacts $C_A$ and $C_B$ are positioned between the hard mask layers 115 of the bit lines and not extended to the top surfaces 115a of the hard mask layers 115. In some embodiments, as shown in FIG. 15A, the top surfaces 165A-a are substantially level with the top surfaces 115a. As shown in FIG. 15B, the top surfaces 165B-a are substantially level with the top surfaces 115a.

Next, referring to FIGS. 16A, 16B and 16C, several contacts plugs 171 and 172 are formed on the contacts $C_A$ and $C_B$, respectively. FIG. 16C is a top view of the substrate 100. FIGS. 16A and 16B are cross-sectional views taken along sectional lines A-A' and B-B' of the structure of FIG. 16C. After the structures as shown in FIGS. 15A and 15B are formed, a second dielectric layer 167 (such as a silicon nitride layer) is formed to cover the hard mask layers 115, the first spacers SP1, the second spacers SP2 and the contacts $C_A$ and $C_B$. Then, several contacts plugs 171 and 172 are formed on the contacts $C_A$ and $C_B$ and penetrate the second dielectric layer 167. As shown in FIG. 16A, 16B, the contact plugs 171, 172 physically contact the contacts $C_A$, $C_B$ respectively and electrically connect the contacts $C_A$, $C_B$ respectively. Accordingly, the top surfaces 165A-a of the top contact parts 165A and the top surfaces 165B-a of the top contact parts 165B are landing surfaces of the contact plugs 171 and 172, respectively. As shown in FIG. 16C, the contact plugs 171 and 172 positioned in two adjacent rows are misaligned with each other in the second direction D2. Thus, the distance between the contact plugs 171 and 172 positioned in adjacent rows can be increased, thereby preventing electrical interference during operation.

Figure 17:
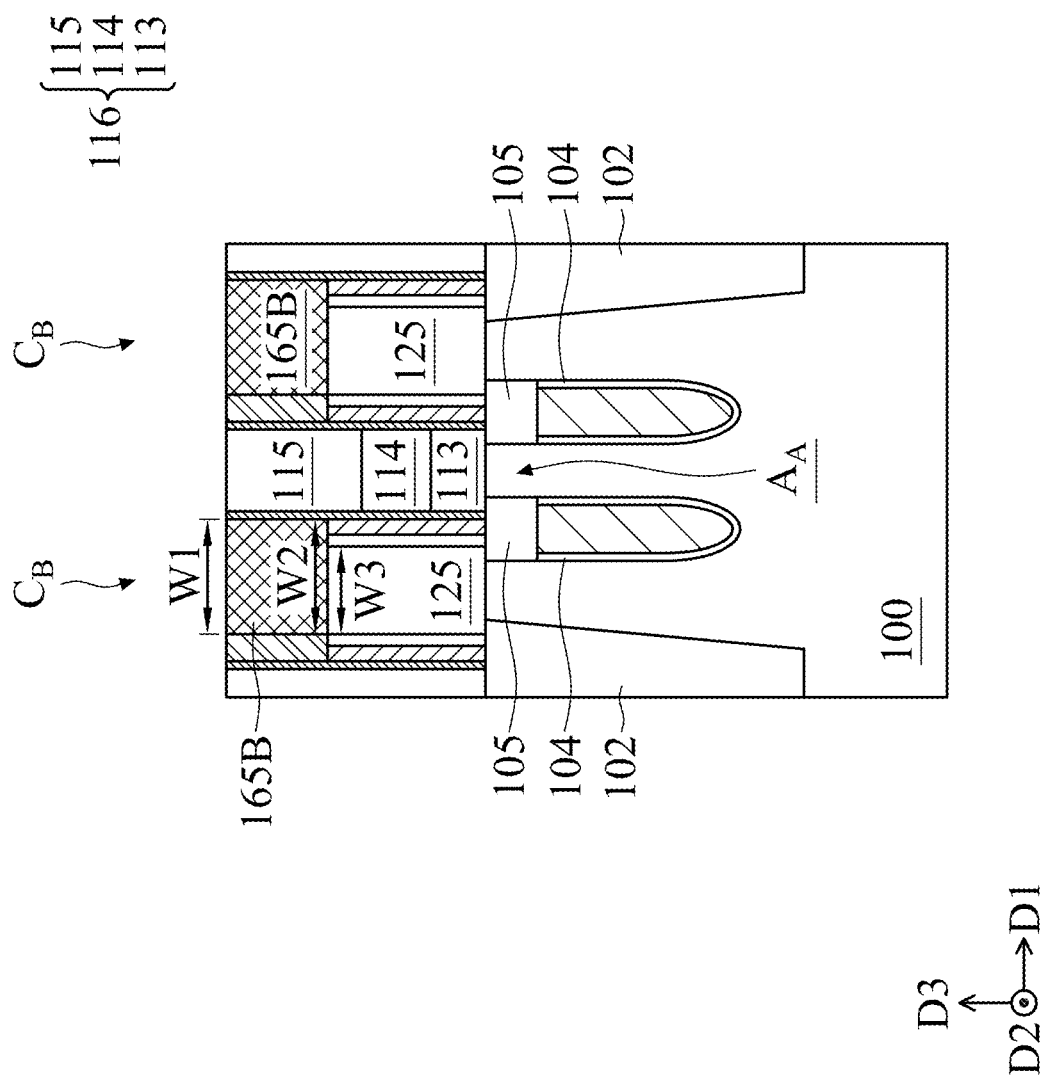
FIG. 17 is a cross-sectional view of a semiconductor structure, in accordance with some embodiments of the present disclosure.

FIG. 17 is a cross-sectional view of a semiconductor structure, in accordance with some embodiments of the present disclosure. The components in FIG. 17 that are the same as those in the structure shown in FIG. 15B use the same reference numerals. The materials and manufacturing methods of those components of the structure in FIG. 17 may be the same as, or similar to, those described in the embodiments above, and therefore the descriptions of these materials and manufacturing methods are not repeated herein.

The semiconductor structure of the embodiment is, for example, applied to a dynamic random access memory (DRAM) device with buried word lines. Several active regions $A_A$ are formed in the substrate 100 of the memory device, and two adjacent active regions $A_A$ are separated by a trench isolation structure 102. The memory device includes several buried word line (WL) sets 104 in the substrate 100, and each of the buried WL sets 104 includes two buried word lines 104A and 104B. As shown in FIG. 17, a buried word line (WL) sets 104 (including two separate buried word lines 104A and 104B) is formed in one of the active regions $A_A$ of the substrate 100. In some embodiments, a bit line is formed above the adjacent buried word lines 104A and 104B, wherein the bit line includes the first conductive layer 113, the second conductive layer 114 and the hard mask layer 115. The buried word lines 104A and 104B are separated from the bit lines 116 by the insulation layers 105. The contacts formed by the manufacturing method in accordance with the embodiments (such as the contacts $C_B$ in FIG. 17) extend downwards to contact the surface of the substrate 100.

The aforementioned semiconductor structures and methods of manufacturing the semiconductor structures, in accordance with some embodiments of the present disclosure, have several advantages. For example, the contacts CA and CB are positioned between the hard mask layers 115 of the bit lines, and the top surfaces 165A-a of the top contact parts 165A and the top surfaces 165B-a of the top contact parts 165B are not higher than the top surfaces 115a of the hard mask layers 115, in accordance with some embodiments of the present disclosure. That is, the contacts (such as CA and CB) of the embodiments do not extend to the top surfaces 115a of the hard mask layers 115. The width W1 of the top surface and the width W2 of the bottom surface of the top contact part 165A, and the width W3 of the top surface of the bottom contact part 125 are shown in FIG. 17. In the existing method for manufacturing the semiconductor structure, especially in the manufacturing process of small-size memory devices, a complicated and expensive process is required to complete the formation of the contacts extending to the top surfaces of the bit lines and the contact plugs subsequently connected to these contacts. Compared with the existing method for manufacturing the semiconductor structure, the semiconductor structure provided in the embodiments can be formed using a general photoresist with a typical photolithography process (for example, the photoresist patterns with the photoresist pattern strips 1411, 1412, 1421 and 1422 as shown in FIG. 5C and FIG. 7C having the width greater than the width of the recess) to form the contacts (such as CA and CB) of the embodiments. Therefore, the semiconductor structure and the method of manufacturing the same as provided in accordance with some embodiments do decrease the process complexity and save the production cost. Furthermore, the semiconductor structure as manufactured in accordance with some embodiments has components with complete profiles (for example, the top surfaces of the contacts having sufficient widths can be the landing surfaces for the contact plugs), and thus has excellent electrical characteristics. Therefore, the memory device applied with the semiconductor structure of the embodiment has good electrical reliability and stable operation performance.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
    a substrate;
    bit lines on the substrate, wherein each of the bit lines comprises:
        a first conductive layer on the substrate;
        a second conductive layer on the first conductive layer; and
        a hardmask layer on the second conductive layer;
    contacts disposed on the substrate and positioned between two adjacent bit lines, wherein bottom surfaces of the contacts physically contact the substrate, and top surfaces of the contacts are not higher than top surfaces of the hardmask layers adjacent to the contacts, wherein each of the contacts comprises a bottom contact part on the substrate and a top contact part on the bottom contact part, and a width of a top surface of the top contact part is greater than a width of a top surface of the bottom contact part, wherein the top contact part covers a first lower spacer portion and does not cover a second lower spacer portion that are respectively formed on opposite sidewalls of the bottom contact part; and
    a plurality of contact plugs respectively disposed on the contacts and partially extending into the contacts, wherein a bottommost portion of each of the contact plugs is disposed within the corresponding contact, and a sidewall of the bottommost portion is in direct contact with a sidewall of the corresponding contact.

2. The semiconductor structure as claimed in claim 1, wherein the top contact part is positioned between two adjacent hardmask layers, wherein the top surfaces of the top contact parts are level with the top surfaces of the hardmask layers.

3. The semiconductor structure as claimed in claim 2, wherein two opposite sidewalls of each of the top contact parts respectively abut spacers on two adjacent hardmask layers, and the spacers have different thicknesses.

4. The semiconductor structure as claimed in claim 1, wherein each of the hardmask layers has a first sidewall and a second sidewall opposite to the first sidewall, and the semiconductor structure further comprises:
    first spacers on the first sidewalls; and
    second spacers on the second sidewalls,
        wherein a thickness of each of the first spacers is different from a thickness of each of the second spacers.

5. The semiconductor structure as claimed in claim 4, wherein each of the first spacers comprises a first nitride layer, and each of the second spacers comprises another first nitride layer and a second nitride layer.

6. The semiconductor structure as claimed in claim 4, wherein each of the first spacers comprises a first nitride layer and a second nitride layer, and each of the second spacers comprises the first nitride layer.

7. The semiconductor structure as claimed in claim 1, wherein the top surfaces of the top contact parts are not higher than the top surfaces of the hardmask layers adjacent to the contacts.

8. The semiconductor structure as claimed in claim 1, wherein the top contact part of each of the contacts is disposed on one of the first lower spacer portion and the second lower spacer portion, and the one of the first lower spacer portion and the second lower spacer portion is disposed between the bottom contact part and the bit line disposed adjacent to the one of the first lower spacer portion and the second lower spacer portion,
    wherein a bottom surface of the top contact part covers the top surface of the underlying bottom contact part and a top surface of the underlying one of the first lower spacer portion and second lower spacer portion.

9. The semiconductor structure as claimed in claim 1, wherein the top surfaces of the bottom contact parts of the contacts are higher than top surfaces of the second conductive layers of the bit lines.

10. The semiconductor structure as claimed in claim 1, wherein the contacts are arranged along a first direction to form a plurality of rows, and the contacts of two adjacent rows are misaligned with each other in a second direction, wherein the second direction is different from the first direction.

11. The semiconductor structure as claimed in claim 10, wherein the contact plugs of two adjacent rows are misaligned with each other in the second direction.

12. A method of manufacturing the semiconductor structure of claim 1, comprising:
    providing a substrate and bit lines formed on the substrate, and a spacer material layer covering sidewalls of a top surface of each of the bit lines, wherein each of the bit lines comprises a conductive layer and a hardmask layer on the conductive layer;
    forming a first contact material layer on the substrate, the first contact material layer covering the spacer material layers on the bit lines;
    etching the first contact material layer to remove a portion of the first contact material layer, a portion of the hardmask layers and a portion of the spacer material layers, thereby recessing the first contact material layer and forming first recesses between remaining portions of the hardmask layers, wherein remaining portions of the first contact material layer form bottom contact parts;

depositing a first dielectric layer over the bottom contact parts, the first dielectric layer conformally formed on sidewalls and bottom surfaces of the first recesses and top surfaces of the remaining portions of the hardmask layers;

patterning the first dielectric layer to remove a portion of the first dielectric layer and expose top surfaces of the bottom contact parts, thereby forming spacers with different thicknesses on two opposite sidewalls of the hardmask layers that protrude from the bottom contact parts, wherein second recesses are formed between two adjacent spacers, and the second recesses expose the top surfaces of the bottom contact parts;

forming top contact parts on the bottom contact parts, wherein top surfaces of the top contact parts are not higher than the top surfaces of the hardmask layers adjacent to the top contact parts, and each of the top contact parts covers a first lower spacer portion and does not cover a second lower spacer portion that are respectively formed on opposite sidewalls of the underlying bottom contact part; and forming a plurality of contact plugs respectively disposed on the top contact parts and partially extending into the top contact parts, wherein a bottommost portion of each of the contact plugs is disposed within the corresponding contact, and a sidewall of the bottommost portion is in direct contact with a sidewall of the corresponding contact.

13. The method of manufacturing the semiconductor structure as claimed in claim 12, wherein the top surfaces of the top contact parts are level with the top surfaces of the hardmask layers.

14. The method of manufacturing the semiconductor structure as claimed in claim 12, wherein the hardmask layers that protrude from the bottom contact parts have first sidewalls and second sidewalls opposite to the first sidewalls, first spacers are formed on the first sidewalls and second spacers are formed on the second sidewalls, wherein thicknesses of the first spacers are different from thicknesses of the second spacers.

15. The method of manufacturing the semiconductor structure as claimed in claim 14, wherein the first recesses are arranged along a first direction to form a plurality of rows, and the first spacers on the first sidewalls of the hardmask layers in different rows have different thicknesses.

16. The method of manufacturing the semiconductor structure as claimed in claim 12, wherein the first recesses are arranged along a first direction to form a plurality of rows, and patterning the first dielectric layer comprises:

performing different patterning steps on portions of the first dielectric layer that are conformally formed on the first recesses arranged in adjacent rows.

17. The method of manufacturing the semiconductor structure as claimed in claim 16, wherein patterning the first dielectric layer comprises:

conformally depositing an etching barrier layer on the first dielectric layer;

providing a first photoresist pattern on the first recesses of i-th row, wherein i is a positive integer, and the first photoresist pattern exposes the etching barrier layer on the first recesses of (i−1)-th row;

performing a first implant step on portions of the etching barrier layer on the first recesses of the (i−1)-th row to form first implanted portions, wherein the first implanted portions are formed on respective portions of the first dielectric layer that are formed on second sidewalls and the top surfaces of the hardmask layers; and removing the first photoresist pattern.

18. The method of manufacturing the semiconductor structure as claimed in claim 17, wherein patterning the first dielectric layer further comprises:

providing a second photoresist pattern on the first recesses of the (i−1)-th row, wherein the second photoresist pattern exposes the etching barrier layer on the first recesses of the i-th row;

performing a second implant step on portions of the etching barrier layer on the first recesses of the i-th row to form second implanted portions, wherein the second implanted portions are formed on other respective portions of the first dielectric layer that are formed on first sidewalls and the top surfaces of the hardmask layers, wherein the first sidewalls are opposite to the second sidewalls; and removing the second photoresist pattern.

19. The method of manufacturing the semiconductor structure as claimed in claim 18, wherein patterning the first dielectric layer further comprises:

removing the first implanted portions and the second implanted portions, thereby leaving non-implanted portions of the etching barrier layer;

removing parts of the first dielectric layer that are uncovered by the non-implanted portions of the etching barrier layer;

removing the non-implanted portions of the etching barrier layer; and removing other parts of the first dielectric layer that are disposed in bottom surfaces of the first recesses, thereby exposing the top surfaces of the bottom contact parts.

20. The method of manufacturing the semiconductor structure as claimed in claim 19, wherein removing parts of the first dielectric layer that are uncovered by the non-implanted portions of the etching barrier layer comprises:

removing first parts of the first dielectric layer that are formed on the second sidewalls of the hardmask layers at the first recesses of the (i−1)-th row; and removing second parts of the first dielectric layer that are formed on the first sidewalls of the hardmask layers at the first recesses of the i-th row.

* * * * *